(12) United States Patent
Hirai et al.

(10) Patent No.: US 8,878,625 B2
(45) Date of Patent: Nov. 4, 2014

(54) IMPEDANCE MATCHING DEVICE

(75) Inventors: Takami Hirai, Toyota (JP); Masahiko Namerikawa, Seto (JP); Shinsuke Yano, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 667 days.

(21) Appl. No.: 13/115,396

(22) Filed: May 25, 2011

(65) Prior Publication Data

US 2012/0019334 A1 Jan. 26, 2012

Related U.S. Application Data

(60) Provisional application No. 61/349,254, filed on May 28, 2010.

(51) Int. Cl.
*H03H 7/38* (2006.01)
*H01F 17/02* (2006.01)
*H01F 17/00* (2006.01)

(52) U.S. Cl.
CPC .............. *H03H 7/38* (2013.01); *H01F 17/02* (2013.01); *H01F 2017/0026* (2013.01)
USPC ........................................ 333/32

(58) Field of Classification Search
USPC ........................................ 333/32
See application file for complete search history.

(56) References Cited

U.S. PATENT DOCUMENTS

| | | | |
|---|---|---|---|
| 5,903,198 A * | 5/1999 | Weiss | 333/24.1 |
| 2001/0035803 A1 | 11/2001 | Matsumura et al. | |
| 2006/0066416 A1 * | 3/2006 | Nicholson et al. | 333/32 |
| 2006/0220776 A1 | 10/2006 | Fujiwara | |
| 2008/0048797 A1 * | 2/2008 | Matters-Kammerer et al. | 333/26 |

FOREIGN PATENT DOCUMENTS

| | | |
|---|---|---|
| JP | 40-19975 | 9/1965 |
| JP | 62-152134 | 7/1987 |
| JP | 01-220842 | 9/1989 |
| JP | 02-058816 | 2/1990 |
| JP | 06-085593 A | 3/1994 |
| JP | 2000-058580 A | 2/2000 |
| JP | 2001-313536 A | 11/2001 |
| JP | 2003-133882 A | 5/2003 |
| JP | 2004-350117 A | 12/2004 |
| JP | 2006-286931 A | 10/2006 |
| JP | 2007-110042 A | 4/2007 |
| JP | 2009/016698 | 2/2009 |
| WO | 2009/016698 A1 | 2/2009 |

OTHER PUBLICATIONS

International Search Report (With English Translation), International Application No. PCT/JP/2011/061231, dated Aug. 16, 2011 (5 pages).

* cited by examiner

*Primary Examiner* — Stephen Jones
(74) *Attorney, Agent, or Firm* — Burr & Brown, PLLC (57) ABSTRACT

The present invention intends to provide a small-sized impedance matching device with a small variation in quality and large-current tolerance. The above described intention of the present invention is achieved by an impedance matching device, which comprises a wiring portion comprising a conductor pattern for wiring, embedded inside or formed on the surface of first dielectric material, and either one or both of an inductor portion comprising a conductor pattern for inductor, embedded inside or formed on the surface of the first dielectric material, or a capacitor portion comprising at least one pair of conductor patterns for capacitor and second dielectric material with a dielectric constant larger than that of the first dielectric material, existing between the pair of conductor patterns for capacitor wherein the thicknesses of the conductor pattern for wiring and the conductor pattern for inductor are 20 μm or more.

12 Claims, 7 Drawing Sheets

IMPEDANCE MATCHING DEVICE

BACKGROUND OF THE INVENTION

1. Field of the Invention

The present invention relates to an impedance matching device. Specifically, the present invention relates to a small-sized impedance matching device with a small variation in quality and large-current tolerance.

2. Description of Related Art

In general, since the output impedance of a semiconductor element consisting of silicon (Si), gallium nitride (GaN) or the like is small, such a semiconductor element is often connected with a circuit for matching impedance when it is connected with an external circuit. Such a semiconductor element is connected with an impedance matching circuit to be capable of matching a characteristic impedance of an external circuit and transmitting the output from the semiconductor element.

The above-described impedance matching circuit is often constituted by a capacitor element and an inductor element consisting of a thin line of conductor connecting the capacitor element and a semiconductor element as described above (for example, metal wire) and the like. In such a configuration, the number of the components (i.e., a capacitor element and an inductor element) constituting an impedance matching circuit is large, the impedance matching circuit tends to be large-sized. However, since an impedance matching circuit is often mounted within a package for protecting a semiconductor element, an impedance matching circuit is required to be small-sized.

In addition, since the large number of components tends to complicate manufacturing process and increase production cost, it is required to suppress the number of components from such a viewpoint. Further, in the above-described configuration where a thin line connecting a semiconductor element and (a capacitor element in) an impedance matching circuit constitute an inductor as described above, the inductance of the inductor element varies when the length or curvature of the thin line varies. Accordingly, in order to achieve desired inductance, it is necessary to precisely control the length or curvature of the thin line, and this is also one of the causes complicating manufacturing process and increasing production cost (for example, refer to Patent Documents 1 and 2).

First, in order to reduce the size of an impedance matching circuit, it is supposed to configure the capacitor element and the inductor element constituting an impedance matching circuit as one component (i.e., an impedance matching device).

Strategies for configuring the capacitor element and the inductor element as one component as described above include forming a conductor pattern constituting the capacitor element, an inductor element, a wiring portion or the like within dielectric material and unifying them. For example, it is supposed to laminate green sheets comprising ceramic material with a conductor pattern screen-printed thereon, fire the resulting laminate, produce a ceramic electronic device comprising a capacitor element and an inductor element therein, and thereby achieve the downsizing of an impedance matching device.

However, in accordance with the method as described above, while downsizing of an impedance matching device can be achieved, it is difficult to form a conductor pattern with a sufficient thickness to achieve large-current tolerance since the conductor pattern is squashed or deformed when the green sheets with a conductor pattern screen-printed thereon are laminated. In addition, there are problems that a sharp edge portion resulting from the squash or deformation on lamination leads to concentration of electric current due to concentration of electric field and, especially when the thickness of a conductor pattern is large, a void between the green sheets adjacent to the conductor pattern leads to decrease in mechanical strength due to concentration of stress (for example, refer to Patent Documents 1 and 2).

CITATION LIST

Patent Literature

[Patent Document 1] Japanese Patent Application Laid-Open (kokai) No. 62-152134
[Patent Document 2] Japanese Patent Application Laid-Open (kokai) No. 1-220842
[Patent Document 3] Japanese Patent Publication (kokoku) No. 40-019975
[Patent Document 4] Japanese Patent Application Laid-Open (kokai) No. 2-058816
[Patent Document 5] International Publication WO 2009/016698

SUMMARY OF THE INVENTION

Problem to be Solved

The resent invention has been created for solving the problems, as mentioned previously, associated with an impedance matching circuit. Namely, the present invention intends to provide a small-sized impedance matching device with a small variation in quality and large-current tolerance.

Means for Solving the Problem

The above described intention of the present invention is achieved by an impedance matching device, which comprises:
  a wiring portion comprising a conductor pattern for wiring, embedded inside or formed on the surface of first dielectric material, and
  either one or both of:
  an inductor portion comprising a conductor pattern for inductor, embedded inside or formed on the surface of the first dielectric material, or
  a capacitor portion comprising at least one pair of conductor patterns for capacitor and second dielectric material with a dielectric constant larger than that of the first dielectric material, existing between the pair of conductor patterns for capacitor;
  wherein the thicknesses of the conductor pattern for wiring and said conductor pattern for inductor are 20 μm or more.

Effect of the Invention

In accordance with the present invention, a small-sized impedance matching device with a small variation in quality and large-current tolerance is provided.

DETAILED DESCRIPTION OF THE INVENTION

The present invention intends to provide a small-sized impedance matching device with a small variation in quality and large-current tolerance.

Namely, the first embodiment of the present invention is:
an impedance matching device, which comprises:
a wiring portion comprising a conductor pattern for wiring, embedded inside or formed on the surface of first dielectric material, and
either one or both of:
an inductor portion comprising a conductor pattern for inductor, embedded inside or formed on the surface of the first dielectric material, or
a capacitor portion comprising at least one pair of conductor patterns for capacitor and second dielectric material with a dielectric constant larger than that of the first dielectric material, existing between the pair of conductor patterns for capacitor;
wherein the thicknesses of the conductor pattern for wiring and the conductor pattern for inductor are 20 μm or more.

As described above, the impedance matching device according to the first embodiment of the present invention is an integral impedance matching device comprising a conductor pattern for wiring, a conductor pattern for capacitor and/or a conductor pattern for inductor, as well as the first dielectric material and the second dielectric material. For such a configuration, the impedance matching device according to the first embodiment of the present invention achieves remarkable downsizing as compared with a conventional impedance matching device constituted by a capacitor element and an inductor element consisting of a thin line of conductor connecting the capacitor element and a semiconductor element (for example, metal wire) and the like. Further, since the impedance matching device according to the first embodiment of the present invention is formed as an integral package, it can suppress variation in inductance, capacitance and the like of individual component and achieve stable quality as compared with a conventional impedance matching device as described above.

The impedance matching device according to the first embodiment of the present invention may comprise either one or both of the inductor portion or the capacitor portion. Namely, in the impedance matching device according to the first embodiment of the present invention, in addition to the wiring portion, only the inductor portion may be included, only the capacitor portion may be included, or both of the inductor portion and the capacitor portion may be included. Also, as a matter of course, the impedance matching device according to the first embodiment of the present invention may comprise multiple numbers of the wiring portions, as well as the inductor portions and/or the capacitor portions respectively as necessary. Namely, the impedance matching device according to the first embodiment of the present invention can be configured variously in accordance with the property of another device connected thereto, its usage environment and the like.

Also, since an impedance matching device is to be used mainly in a high frequency wave application, it is necessary to suppress parasitic capacitance. Accordingly, it is desirable that the inductor portion and the wiring portion are formed of dielectric material with a low dielectric constant and a conductor pattern to suppress parasitic capacitance. In other words, it is desirable that the first dielectric material has a relatively low dielectric constant as compared with the second dielectric material.

On the other hand, it is desirable that the size as an element of the capacitor portion is small and the capacitance thereof is large. Accordingly, it is desirable that the capacitor portion is formed of dielectric material with a high dielectric constant and a conductor pattern to increase capacitance. In other words, it is desirable that the second dielectric material has a relatively high dielectric constant as compared with the first dielectric material.

The impedance matching device configured as described above is an integral impedance matching device comprising a conductor pattern for wiring, a conductor pattern for capacitor and/or a conductor pattern for inductor, as well as the first dielectric material and the second dielectric material, and can be produced in smaller size as compared with a conventional impedance matching circuit. Also, for downsizing, it is desirable that these conductor patterns are formed within the dielectric material. However, it is needless to say that, for the purpose of connecting with another device and the like, at least part of the conductor pattern may be exposed at the surface of the dielectric material.

As the dielectric material, ceramic material is more desirable than resin such as plastic, since it is desirable that, as described above, material with a high dielectric constant is used in the capacitor portion.

In addition, as conductor for configuring the various conductor patterns, metal with a low dielectric constant is desirable and, for example, gold (Au), silver (Ag), copper (Cu) and the like can be exemplified, but not limited thereto. In addition, combination of multiple kinds of metals may be used. By the way, since all of these metals have a low melting point, as the ceramic material, what is called "Low Temperature Co-fired Ceramics material (LTCC material)" is desirable, which can be fired coincidentally with these metals.

As the LTCC material with a high dielectric constant used in the capacitor portion, for example, $BaO$—$TiO_2$—$Nd_2O_3$ composition series, $Bi_2O_3$—$Nb_2O_5$ composition series and the like can be exemplified, but not limited thereto. In addition, although, as the dielectric material used in the inductor portion and the wiring portion, dielectric material with a relatively low dielectric constant is desirable, as mentioned previously, from a viewpoint of a production process, material which can be fired coincidentally with the LTCC material with a high dielectric constant used in the capacitor portion is desirable. Specifically, as the dielectric material with a relatively low dielectric constant used in the inductor portion and the wiring portion, for example, material consisting primarily of glass, $BaO-Al_2O_3-SiO_2$ composition series and the like can be exemplified, but not limited thereto.

As the conductor pattern for inductor embedded inside or formed on the surface of the low-dielectric constant material, for example, concentrated constant type of material in a coil-like shape and distributed constant type of material can be exemplified, but suitable material can be properly chosen in accordance with the frequency of a used signal and required inductance value.

By the way, through the conductor pattern for wiring and the conductor pattern for inductor embedded inside or formed on the surface of the low-dielectric constant material, for example, large current amplified by a semiconductor amplifying device used in a high frequency wave power amplifier such as a base transceiver station for mobile-phones, an industrial radio-frequency heating apparatus and the like flows. Accordingly, it is desirable that these conductor patterns are low-resistant and low loss, and it is desirable that the resistance values thereof are decreased by increasing the thickness of the conductor.

Specifically, in the impedance matching device according to the first embodiment of the present invention, it is desirable that the thicknesses of the conductor pattern for wiring and the conductor pattern for inductor are 20 μm or more. More preferably, it is desirable that the thicknesses of the conductor pattern for wiring and the conductor pattern for inductor are 30 μm or more. In case where the thicknesses of the conductor pattern for wiring and the conductor pattern for inductor are less than 20 μm, it is not desirable since the resistance values of these conductor patterns increase and the losses thereof also increase when being connected with a high power high frequency wave device as mentioned above. Herein, the "thickness" refers to the shorter one of the height and width of the cross-section orthogonal to the longitudinal direction (direction in which an electric current flows) of the conductor pattern for wiring and the conductor pattern for inductor.

Next, the second embodiment of the present invention is:

the impedance matching device according to the previously mentioned first embodiment, wherein:

the cross-section orthogonal to the longitudinal direction of at least part of the conductor pattern for wiring and the conductor pattern for inductor has a shape of rectangle.

As mentioned previously, for example, it is known to laminate green sheets comprising ceramic material with a conductor pattern screen-printed thereon, fire the resulting laminate, as a method for producing an device wherein a conductor is embedded inside or on the surface of dielectric material such as ceramic material. However, in accordance with such a method, a conductor pattern is likely to be squashed or deformed when the green sheets with a conductor pattern printed thereon are laminated, and it is difficult to form a conductor pattern with a sufficient thickness to achieve large-current tolerance. In addition, a risk that a sharp edge portion in the shape of a cross-section of a conductor resulting from the squash or deformation on lamination leads to concentration of electric current due to concentration of electric field increases. Further, especially when the thickness of a conductor pattern is large, a void between the green sheets adjacent to a conductor pattern may lead to decrease in mechanical strength due to concentration of stress.

Figure 3:
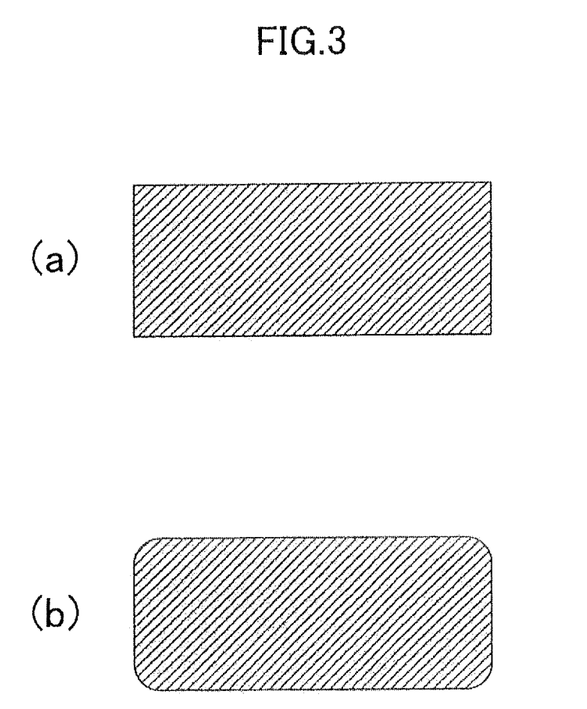
FIG. 3(a) illustrates an embodiment of a conductor pattern of the present invention having a rectangular shape in a cross-section orthogonal to the longitudinal direction of the conductor pattern, as recited in claim 2.
FIG. 3(b) illustrates an embodiment of a conductor pattern of the present invention having a rectangular shape with the corners of the cross-section rounded off in a cross-section orthogonal to the longitudinal direction of the conductor pattern, as recited in claim 3.

Namely, when being connected with a high power high frequency wave device as described above, it is desirable that the conductor pattern for wiring and the conductor pattern for inductor are low-resistant and low loss, and it is important that the squash or deformation on lamination as described above do not occur. Accordingly, in the impedance matching device according to the second embodiment of the present invention, it is desirable that the conductor pattern for wiring and the conductor pattern for inductor maintain their intended shape as formed by a technique such as screen-printing and the like. In other words, in the impedance matching device according to the second embodiment of the present invention, it is desirable that, in at least part of the conductor pattern for wiring and the conductor pattern for inductor, the cross-section orthogonal to the longitudinal direction thereof has a shape of rectangle. An example of a conductor pattern having a cross-section orthogonal to the longitudinal direction of the conductor pattern is shown in FIG. 3(a).

As described above, in the impedance matching device according to the second embodiment of the present invention, the conductor pattern for wiring and the conductor pattern for inductor have a rectangular shape of their cross-section, and thereby it is possible to maintain a sufficient thickness and exclude a sharp edge portion. As a result, when the impedance matching device according to the present embodiment is connected with a high power high frequency wave device as mentioned previously, it can be low-resistant and low loss.

On the other hand, it is needless to say that even when the conductor pattern for wiring and the conductor pattern for inductor have a rectangular shape of their cross-section, it is desirable to avoid problems such as decrease in mechanical strength and occurrence of separation due to concentration of stress resulting from a void between dielectric material such as ceramic material and these conductor patterns.

As a method suitable for forming and maintaining the conductor pattern for wiring and the conductor pattern for inductor with a cross-section in a rectangular shape while suppressing the occurrence of a void between dielectric material and the conductor patterns as described above, for example, the following method can be exemplified.

A ceramic fired body suitable as the impedance matching device according to the second embodiment of the present invention can be obtained by drying and thereafter firing a ceramic powder compact manufactured by a method for manufacturing a ceramic powder compact including a first process wherein, first, conductor paste comprising powder of at least one of metals such as gold (Au), silver (Ag), copper (Cu) and the like and resin is formed on film, a second process wherein the film with the conductor paste formed thereon is placed inside a pouring mold, and a third process wherein slurry comprising precursor of thermosetting resin, ceramic powder and solvent is poured into and cured in the pouring mold and characterized in that a ceramic powder compact with a conductor powder compact embedded therein is manufactured (for example, refer to International Publication WO 2009/016698, the content thereof is incorporated herein by reference). In addition, by laminating multiple ceramic powder compacts as described above, more complicated configuration can be manufactured. However, the above-described method is not more than an example, and a method for manufacturing the impedance matching device according to the second embodiment of the present invention is not limited to the above-described method.

Next, the third embodiment of the present invention is:

the impedance matching device according to the previously mentioned second embodiment, wherein:

at least one of the corners of the cross-section is rounded off.

As mentioned in the previously mentioned second embodiment, when a sharp edge portion in the shape of a cross-section of a conductor pattern occurs due to squash or deformation of a conductor pattern, a risk of concentration of electric current due to concentration of electric field increases. Accordingly, as the conductor pattern in the impedance matching device according to the previously mentioned second embodiment, a conductor pattern with a cross-section in a rectangular shape is desirable, and, more preferably, it is desirable that at least one of the corners of the cross-section shape is rounded off. An example of a conductor pattern having a rectangular cross-section with rounded off corners in a direction orthogonal to the longitudinal direction of the conductor pattern is shown in FIG. (3b).

A corner rounded off as described above can suppress a risk of concentration of electric current due to concentration of electric field when being used as an impedance matching device. In addition, although there is a risk that a void or crack occurs at a boundary between the conductor compact and the slurry in accordance with the shrinkage of the slurry when a ceramic powder compact obtained by the previously mentioned manufacturing method is dried, a corner rounded off as described above can suppress concentration of stress at the corner portion of the cross-section of the conductor pattern, and suppress the occurrence of a void or crack in accordance with drying of the slurry The above-described "corner is rounded off" refers to a situation that the portion where, inherently, two edges in a rectangle should have constituted a corner is dulled, and it is not required that the portion presents an arc. For example, the portion may present a shape of polygon consisting of multiple edges and multiple obtuse angles formed by the edges. Although the radius of curvature when the corner portion of rectangle is treated as an arc, including a case of polygon, is not particularly limited, it is desirable that the radius of curvature of the portion corresponding to the corner of the cross-section of the rectangle is preferably 1/20 or more of the thickness of the cross-section, more preferably 1/10 or more of the thickness of the cross-section, furthermore preferably 1/8 or more of the thickness of the cross-section.

Next, the fourth embodiment of the present invention is:

the impedance matching device according to one of the previously mentioned first to third embodiments, which further comprises:

an electrode for bonding a conductor component to electrically connect the impedance matching device and another device.

Since metal wire or metal ribbon is often used to connect the impedance matching device according to the present invention and another device, it is desirable that an electrode for bonding these wire and ribbon is formed in the impedance matching device according to the present invention.

Next, the fifth embodiment of the present invention is:

the impedance matching device according to the previously mentioned fourth embodiment, wherein:

the electrode for bonding is embedded in the impedance matching device, and at least one of the surfaces of the electrode for bonding is exposed at the surface of the impedance matching device, with its surface flush with the surface of the impedance matching device.

As mentioned in the previously mentioned fourth embodiment, the electrode for bonding intends to connect the impedance matching device according to the present invention and another device, and it is desirable that the electrode for bonding is surely and easily connected with the wire, ribbon and the like used for the connection. Specifically, in order to increase the effective area on bonding, it is desirable that the surface of the electrode for bonding is smooth. In addition, for easy bonding on implementation, it is desirable that the electrode for bonding neither protrudes nor is recessed from the surface where the electrode is formed of the impedance matching device according to the present invention. In other words, it is desirable that the electrode for bonding is exposed in surface identical to the surface of the impedance matching device in which the electrode is formed.

The sixth embodiment of the present invention is:

the impedance matching device according to the previously mentioned fourth or fifth embodiment, wherein:

the impedance matching device comprises at least one of the inductor portions, the electrode for bonding is formed on the surface of the first dielectric material, the electrode for bonding is connected with one of the terminals of the inductor portion, and the size and shape of the electrode for bonding is configured so that the inductance of the part comprising the electrode for bonding and the inductor portion can be adjusted by varying the connecting location between a thin line and the electrode for bonding when the thin line is disposed between the electrode for bonding and another device to electrically connect the impedance matching device and another device.

As described above, in the impedance matching device according to the sixth embodiment of the present invention, the electrode for bonding connected to one end of the inductor portion is formed on the surface of the first dielectric material. The electrode for bonding is an electrode to which the thin line is connected when the impedance matching device and another device are electrically connected. Accordingly, the electrode for bonding necessarily has a minimum area required for bonding the thin line, but it may present a line-like shape having one end on the side connected to one end of the inductor portion and the other end. In addition, the electrode for bonding may be linear or curved. Although, as a shape of an electrode for bonding, a line-like shape has been exemplified, the size and shape of the electrode for bonding used in the impedance matching device according to the present embodiment can be adjusted in accordance with various conditions such as the design of the device, the property of another device connected thereto and the like.

In this case, the length of the path from the bonding location to the connecting location between the inductor portion and the electrode for bonding varies in accordance with at which point on the electrode for bonding the thin line is bonded. Namely, depending on at which point on the electrode for bonding the thin line is bonded, the length of the path though which electric current flows in the electrode for bonding varies, and the inductance of the electrode for bonding varies. As a result, in accordance with at which point on the electrode for bonding the thin line is bonded, the inductance of the whole portion obtained by combining the inductor portion and the electrode for bonding can be adjusted.

Also, the seventh embodiment of the present invention is:

the impedance matching device according to the previously mentioned sixth embodiment, wherein:

the electrode for bonding has a shape with multiple wide portions for connecting the thin line and narrow portions connecting the wide portions formed continuously and alternately.

As mentioned in the previously mentioned sixth embodiment, the shape of the electrode for bonding can be properly adjusted in accordance with various conditions such as the design of the impedance matching device according to the present embodiment, the property of another device connected thereto and the like. However, for a reason related to a manufacturing process and the like, in some cases, it maybe desirable that the inductance of the whole portion obtained by combining the inductor portion and the electrode for bonding is not adjusted continuously, but is adjusted in a stepwise manner.

Figure 4:
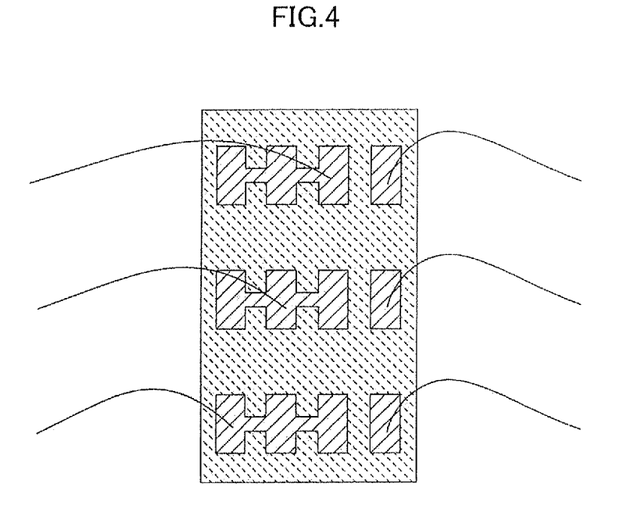
FIG. 4 illustrates an embodiment of the impedance matching device of the present invention in which the electrode for bonding includes multiple wide portions for connecting the thin line, with narrow portions connecting the wide protions, as recited in claim 7.

In such a case, the location at which the thin line is bonded with the electrode for bonding should not be adjusted continuously, but should be adjusted in a stepwise manner. Accordingly, multiple locations at which the thin line should be bonded on the electrode for bonding have been predetermined, and the thin line is not bonded at any locations other than these locations. As a result, multiple locations at which the thin line should be bonded on the electrode for bonding need to have a minimum area required for bonding the thin line, while any locations other than these locations may have a minimum width required for electrically connecting the "multiple locations" and fulfilling the inductance according to the bonding location. For such reasons, in the present embodiment, the electrode for bonding has a shape with multiple wide portions for connecting the thin line and narrow portions connecting the wide portions formed continuously and alternately. An example of the impedance matching device including an electrode for bonding that includes multiple wide portions for connecting the thin line with narrow portions connecting the wide portions, is shown in FIG. 4.

By means of the configuration as described above, depending on to which wide portion among the multiple wide portions, which the electrode for bonding comprises, the thin line is bonded, the inductance of the electrode for bonding varies in a stepwise manner. As a result, in accordance with to which wide portion among the multiple wide portions, which the electrode for bonding comprises, the thin line is bonded, the inductance of the whole portion obtained by combining the inductor portion and the electrode for bonding can be adjusted in a stepwise manner.

Further, the eighth embodiment of the present invention is:

the impedance matching device according to the previously mentioned sixth embodiment, wherein:

the electrode for bonding is formed of multiple pads and one or more inductor portion for adjustment, the inductor portion for adjustment comprises a conductor pattern for adjustment formed within the first dielectric material, each of the multiple pads is connected by the inductor portion for adjustment, the inductance of the part comprising the electrode for bonding, the inductor portion for adjustment and the inductor portion can be adjusted by with which one among the multiple pads the thin line is connected when the thin line is disposed between the electrode for bonding and another device to electrically connect the impedance matching device and another device.

The "pad" in the present embodiment corresponds to each of the "wide portions" in the previously mentioned seventh embodiment, and the "inductor portion for adjustment" in the present embodiment corresponds to the respective "narrow portion" in the previously mentioned seventh embodiment.

Also, as described above, instead of the "narrow portion" in the seventh embodiment, the "inductor portion for adjustment" is disposed, and thereby the adjustment range of inductance, which can be varied depending on to which one among the multiple pads the thin line is connected, can be widened. From a viewpoint of suppression of parasitic capacitance, it is desirable that the inductor portion for adjustment is also formed inside the first dielectric material.

Figure 5:
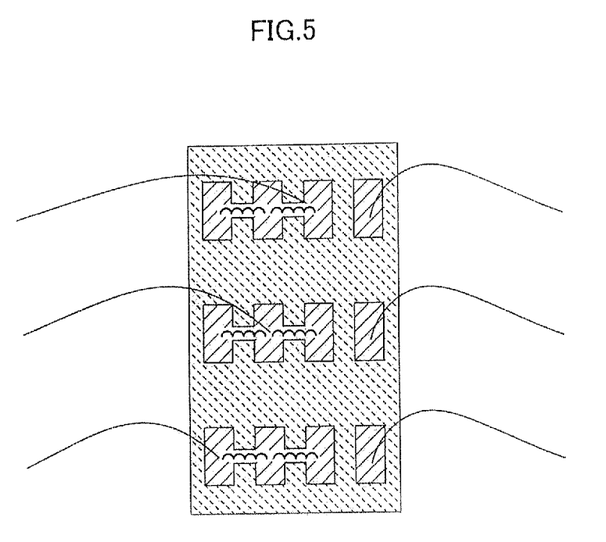
FIG. 5 illustrates an embodiment of the impedance matching device of the present invention in which the electrode for bonding includes multiple pads and two (one or more) inductor portions for adjustment, which meets the claim elements recited in claim 8.

By means of the configuration as described above, depending on to which pad among multiple pads the thin line is bonded, the inductance of the electrode for bonding varies in a stepwise manner. As a result, in accordance with to which pad among the multiple pads the thin line is bonded, the inductance of the whole portion obtained by combining the inductor portion and the electrode for bonding can be adjusted in a stepwise manner. An example of the impedance matching device in which the electrode for bonding includes multiple pads and two inductor portions for adjustment, is shown in FIG. 5.

As mentioned previously, the impedance matching device according to the present invention may comprise either one or both of the inductor portion or the capacitor portion. Namely, in the impedance matching device according to the present invention, in addition to the wiring portion, only the inductor portion may be included, only the capacitor portion may be included, or both of the inductor portion and the capacitor portion may be included. Also, as a matter of course, the impedance matching device according to the present invention may comprise multiple numbers of the wiring portions, as well as the inductor portions and/or the capacitor portions respectively as necessary. Namely, the impedance matching device according to the present invention can be configured variously in accordance with the property of another device connected thereto, its usage environment and the like.

Accordingly, the ninth embodiment of the present invention is:

the impedance matching device according to one of the previously mentioned sixth to eighth embodiments, wherein:

the impedance matching device comprises at least one of the capacitor portions, the impedance matching device further comprises a ground electrode formed within or on the surface of the impedance matching device, one terminal of the capacitor portion is connected to the ground electrode, the other terminal of the capacitor portion is connected to either one of the terminals of the inductor portion.

Also, the tenth embodiment of the present invention is:

the impedance matching device according to the previously mentioned ninth embodiment, wherein:

the impedance matching device comprises at least two of the inductor portion, one terminal of a first inductor portion is connected to the electrode for bonding, the other terminal of the first inductor portion is connected to a second inductor portion, a terminal of the capacitor portion, which is not connected to the ground electrode, is connected to the portion where the first inductor portion and the second inductor portion are connected.

By the way, the various conductor patterns for inductor in the impedance matching device according to the present invention can be in various shapes in accordance with the shape and size of the impedance matching device, the property of another device connected thereto and the like. Specifically, conductor patterns with various shapes such as linear, curved, coil-like, meander-like and the like can be used as the various inductor portions in the impedance matching device according to the present invention. Also, conductor pattern with such shapes can be manufactured by various manufacturing methods including the previously mentioned method for manufacturing ceramic powder compact.

Figure 6:
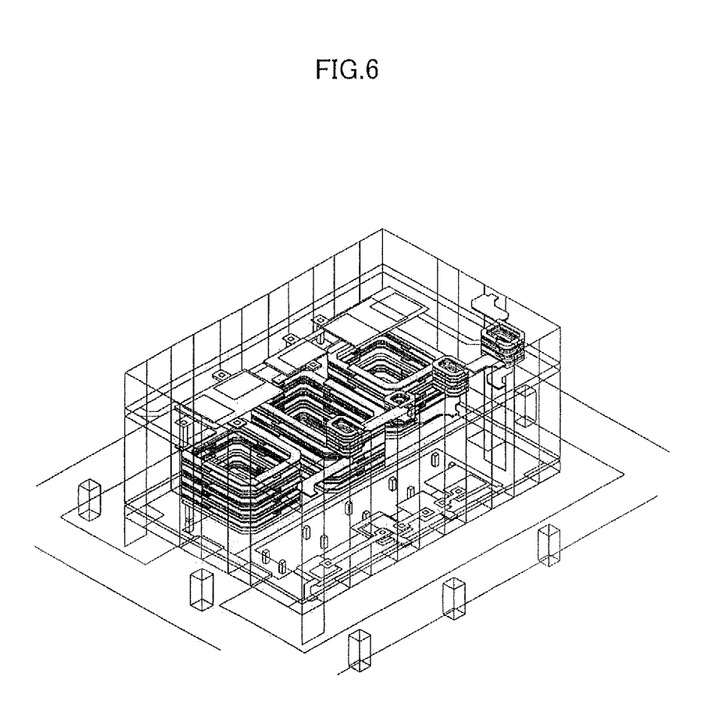
FIG. 6 illustrates an embodiment of the impedance matching device of the present invention in which part of the conductor pattern for the inductor and the conductor pattern for the inductor for adjustment have coil-like shapes, which meets the claim elements recited in claim 11.

Accordingly, the eleventh embodiment of the present invention is:

the impedance matching device according to one of the previously mentioned first to tenth embodiments, wherein:

at least part of the conductor pattern for inductor or the conductor pattern for the inductor for adjustment has a coil-like shape. An example of the impedance matching device in which the conductor pattern for the inductor and the conductor pattern for the inductor for adjustment have coil-like shapes, is shown in FIG. 6.

Figure 7:
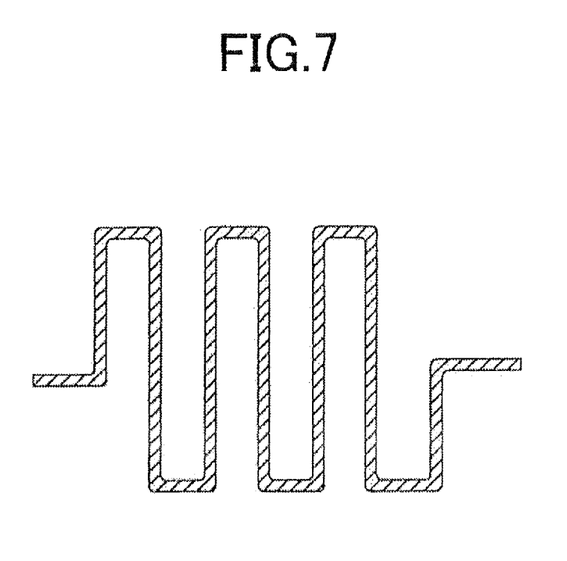
FIG. 7 illustrates an embodiment of a conductor pattern of the present invention for the inductor or the inductor for adjustment having a meander-like shape, as recited in claim 12.

Also, the twelfth embodiment of the present invention is:

the impedance matching device according to one of the previously mentioned first to tenth embodiments, wherein:

at least part of the conductor pattern for inductor or the conductor pattern for the inductor for adjustment has a meander-like shape. An example of a conductor pattern for the inductor or the inductor for adjustments having a meander-like shape is shown in FIG. 7.

Further, as mentioned initially, conductor components themselves, such as metal wire and metal ribbon, for electrically connecting the impedance matching device according to the present invention and another device can be inductors. Accordingly, when, via such a conductor component, the impedance matching device according to each of the previously mentioned embodiments is connected with another device, it may be configured so that the combination of the inductance of the conductor component and the inductance of the electrode for bonding, the wiring portion, the inductor portion and the inductor portion for adjustment (if any) of the impedance matching device comes to a desired inductance value.

Also, multiple conductor components (for example, metal wire, metal ribbon and the like) may be used to connect the impedance matching device and another device. Specifically, multiple metal wires are desirably used, for example, when it is difficult to use one metal wire to decrease the inductance presented by the metal wire to a desired level even though the length and curvature of the metal wire are adjusted, and when power is too large to be transmitted through one metal wire, and the like.

Although the examples described below will more particularly explain the present invention, the technical scope of the present invention is not limited to these examples.

EXAMPLE (1) Explanation Based on an Equivalent Circuit

Figure 1:
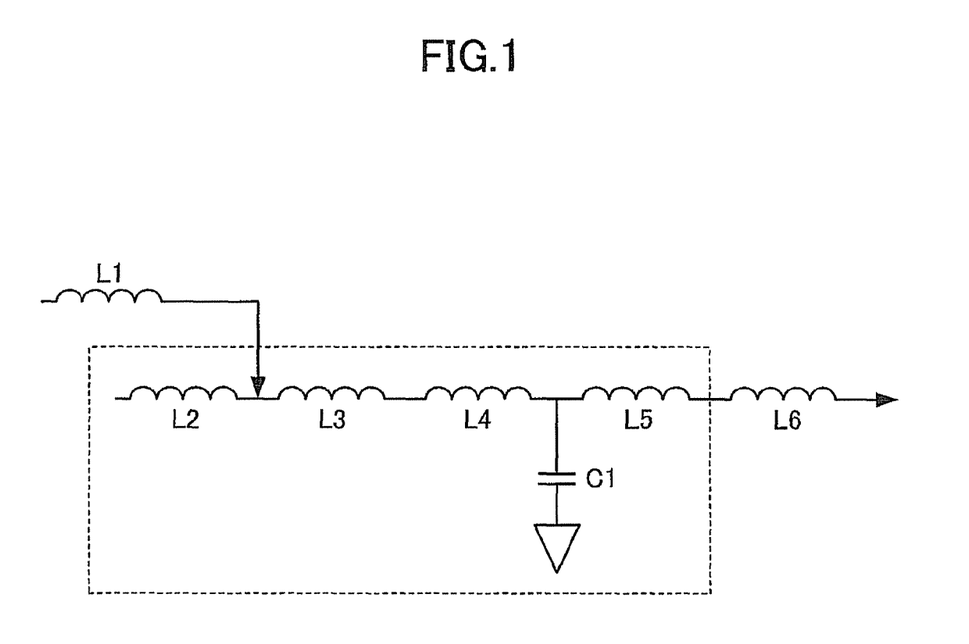
FIG. 1 is an equivalent circuit schematic showing the configuration of an impedance matching device according to one embodiment of the present invention.

FIG. 1 is an equivalent circuit schematic showing the configuration of an impedance matching device according to the present example. Components inside the tetragonal frame depicted with dotted line in FIG. 1 represent components included in the impedance matching device according to the present example. Namely, in FIG. 1, L1 and L6 are components not included in the impedance matching device according to the present example, and specifically represent metal wires for connecting the impedance matching device according to the present example and another device (for example, an external circuit such as high frequency wave semiconductor amplifier).

On the other hand, L4 and L5 represent inductor portions embedded inside the first dielectric material D1 (not shown in FIG. 1) in the impedance matching device according to the present example. To the portion where the inductor portions L4 and L5 are connected, the capacitor portion C1 is connected, and the other end of the capacitor portion C1 is connected to the ground electrode. In addition, between a pair of the conductor patterns for capacitor CC1 (not shown in FIG. 1) as components of the capacitor portion C1, the second dielectric material D2 (not shown in FIG. 1) with a dielectric constant higher than that of the first dielectric material D1 intermediates.

Also, L2 and L3 schematically show the inductances presented by one electrode for bonding E1 (not shown in FIG. 1) of the impedance matching device according to the present example. It is represented that, as mentioned in the explanation about the impedance matching device according to the previously mentioned sixth embodiment, depending on at which point on the electrode for bonding E1 the metal wire L1 for connecting the impedance matching device according to the present example and another device is bonded, the inductance presented by the electrode for bonding E1 varies.

One end of the above-described electrode for bonding E1 is connected to the end, which is on the opposite side to the inductor portion L5, of the inductor portion L4. In addition, to the end, which is on the opposite side to the inductor portion L4, of the inductor portion L5, another electrode for bonding E2 (not shown in FIG. 1) is connected and the metal wire L6 is connected to the electrode E2.

(2) Explanation Based on a Configuration Diagram

Figure 2:
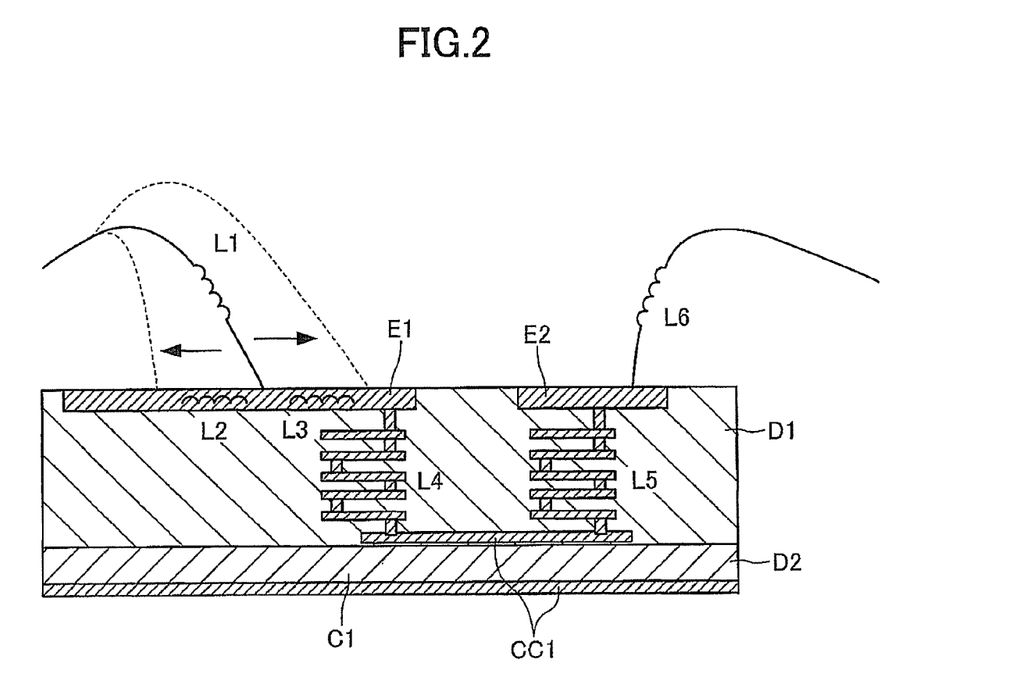
FIG. 2 is a cross-section view showing the schematic configuration of an impedance matching device according to one embodiment of the present invention.

FIG. 2 is a cross-section view showing the schematic configuration of an impedance matching device according to the present example. As shown in FIG. 2, the inductor portions L4 and L5 respectively comprising a conductor pattern for inductor in a coil-like shape are embedded inside the first dielectric material D1. On the other hand, a pair of the conductor patterns for capacitor CC1 is formed so as to sandwich the second dielectric material D2 laminated below the first dielectric material D1 and constitutes the capacitor portion C1. The second dielectric material D2 has a higher dielectric constant than the first dielectric material D1. Further, at the upper surface of the first dielectric material D1, the electrodes for bonding E1 and E2 are formed so as to be exposed in a surface identical to the upper surface of the first dielectric material D1.

The conductor patterns (to which reference signs are not assigned) embedded inside the first dielectric material D1 connect the electrode for bonding E1, the inductor portion L4, the inductor portion L5, and the electrode for bonding E2 in this order and in series. In addition, between the inductor portion L4 and the inductor portion L5, the upper conductor pattern for capacitor of a pair of the conductor patterns for capacitor CC1 included in the capacitor portion C1 is connected, and the lower conductor pattern for capacitor facing the upper conductor pattern for capacitor across the second dielectric material D2 doubles as a ground electrode.

As described above, although the impedance matching device according to the present example comprises two inductor portions and one capacitor portion, the size of the whole device is successfully decreased by equipping, as an integrally molded body, these components, as well as the first and second dielectric materials. In addition, by manufacturing as such an integrally molded body, as compared with a conventional impedance matching circuit manufactured by connecting an inductor consisting of metal thin line having given length and curvature etc with a capacitor, variation in inductance and the like can be suppressed.

Also, since, as mentioned previously, the impedance matching device according to the present invention should be low-resistant and low loss even when it is connected with a high power high frequency wave device as mentioned previously, the thicknesses of the conductor pattern for wiring and the conductor patterns constituting the inductor portions L4 and L5 are desirably 20 μm or more, more preferably 30 μm or more.

Further, the electrode for bonding E1, as mentioned previously, in accordance with at which point on the electrode for bonding E1 the metal wire for connecting the impedance matching device according to the present example and another device is bonded (represented by the arrows in FIG. 2), the inductance presented by the electrode for bonding E1 varies. Thereby, the inductance of the portion obtained by combining the inductor portion L4 and the electrode for bonding E1, which exists on the left side from the capacitor portion C1, can be adjusted.

By the way, as mentioned previously, conductor components themselves, such as metal wire and metal ribbon, for electrically connecting the impedance matching device according to the present invention and another device can be inductors. Accordingly, in FIG. 2, the metal wires for connecting the impedance matching device according to the present example and another device are represented as the inductor portions L1 and L6. In some cases, when the impedance matching device according to the present example is connected with another device, it may be necessary to be configured so that the combination of the inductance of the conductor component and the inductance of the electrode for bonding, the wiring portion, the inductor portion and/or the inductor portion for adjustment of the impedance matching device comes to a desired inductance value.

Namely, the configuration of the impedance matching device according to the present example corresponds to the impedance matching devices according to the previously mentioned sixth and eleventh embodiments. An impedance matching device with such a configuration can be obtained by manufacturing a ceramic powder compact with a conductor powder compact embedded therein, drying and thereafter firing the resulting ceramic powder compact as mentioned previously. However, the above-described method is not more than an example, and a method for manufacturing the impedance matching device according to the present invention is not limited to the above-described method. In addition, in the present example, the metal wire itself for electrically connecting the impedance matching device according to the present example and another device is taken into account as an inductor.

(3) Conclusion

As the above, the impedance matching device according to the present example succeeds in with a small variation in quality, large-current tolerance, and downsizing of the whole device by its configuration as mentioned above.

Although, in the present example, while taking the metal wire itself for electrically connecting the impedance matching device according to the present example and another device into account as an inductor, focusing attention on those having the features of the impedance matching devices according to the previously mentioned eighth and eleventh embodiments, their configuration and superiority have been explained, the scope of the present invention does not remain therein and should be construed based on the description in the present specification and claims.

Although, as mentioned previously, various embodiments and examples of the impedance matching devices according to the present invention have been explained in detail, these are absolutely exemplifications, and the scope of the present invention is not limited to such exemplifications. Also, the present invention can be suitably applied to a high frequency wave power amplifier used in, for example, a base transceiver station for mobile-phones, an industrial radio-frequency heating apparatus and the like. However, it is needless to say that the present invention is not limited to these applications.

REFERENCE SIGNS LIST

L1: metal wire (its equivalent inductance being taken into account), L2: part of electrode for bonding E1 (its equivalent inductance being taken into account), L3: part of electrode for bonding E1 (its equivalent inductance being taken into account), L4: inductor portion, L5: inductor portion, L6: metal wire (its equivalent inductance being taken into account), C1: capacitor portion, CC1: conductor patterns for capacitor, E1: electrode for bonding, E2: electrode for bonding, D1: first dielectric material, and D2: second dielectric material.

The invention claimed is:

1. An impedance matching device, which comprises:
   a wiring portion comprising a conductor pattern for wiring, embedded inside or formed on the surface of a first dielectric material,
      an inductor portion comprising a conductor pattern for inductor, embedded inside or formed on the surface of said first dielectric material, and
      a capacitor portion comprising at least one pair of conductor patterns for capacitor and a second dielectric material with a dielectric constant larger than that of said first dielectric material, existing between the pair of conductor patterns for capacitor;
   wherein a thicknesses of said conductor pattern for wiring and said conductor pattern for inductor are 20 μm or more, and
   wherein the wiring portion, the first dielectric material, the inductor portion, and the capacitor portion are tired to form a ceramic body.

2. The impedance matching device according to claim 1, wherein:
   at least part of said conductor pattern for inductor or said conductor pattern for said inductor for adjustment has a coil-like shape.

3. The impedance matching device according to claim 1, wherein:
   at least part of said conductor pattern for inductor or said conductor pattern for said inductor for adjustment has a meander-like shape.

4. The impedance matching device according to claim 1, wherein:
   the cross-section orthogonal to the longitudinal direction of at least part of said conductor pattern for wiring and said conductor pattern for inductor has a shape of rectangle.

5. The impedance matching device according to claim 4, wherein: at least one of the corners of said cross-section is rounded off.

6. The impedance matching device according to claim 1, which further comprises:
   an electrode for bonding a conductor component to electrically connect the impedance matching device and another device.

7. The impedance matching device according to claim 6, wherein:
- said electrode for bonding is embedded in the impedance matching device, and
- at least one of the surfaces of said electrode for bonding exposes at the surface of the impedance matching device, with its surface flush with the surface of the impedance matching device.

8. The impedance matching device according to claim 6, wherein:
- the impedance matching device comprises at least one of said inductor portion,
- said electrode for bonding is formed on the surface of said first dielectric material,
- said electrode for bonding is connected with one of the terminals of said inductor portion, and
- the size and shape of said electrode for bonding is configured so that the inductance of the part comprising said electrode for bonding and said inductor portion can be adjusted by varying the connecting location between a thin line and said electrode for bonding when said thin line is disposed between said electrode for bonding and another device to electrically connect the impedance matching device and another device.

9. The impedance matching device according to claim 8, wherein:
- said electrode for bonding has a shape with multiple wide portions for connecting said thin line and narrow portions connecting the wide portions formed continuously and alternately.

10. The impedance matching device according to claim 8, wherein:
- said electrode for bonding is formed of multiple pads and one or more inductor portion for adjustment,
- said inductor portion for adjustment comprises a conductor pattern for adjustment formed within said first dielectric material,
- each of said multiple pads is connected by said inductor portion for adjustment,
- the inductance of the part comprising said electrode for bonding, said inductor portion for adjustment and said inductor portion can be adjusted by with which one among said multiple pads said thin line is connected when said thin line is disposed between said electrode for bonding and another device to electrically connect the impedance matching device and another device.

11. The impedance matching device according to claim 8, wherein:
- the impedance matching device comprises at least one of said capacitor portion,
- the impedance matching device further comprises a ground electrode formed within or on the surface of the impedance matching device,
- one terminal of said capacitor portion is connected to said ground electrode,
- the other terminal of said capacitor portion is connected to either one of the terminals of said inductor portion.

12. The impedance matching device according to claim 11, wherein:
- the impedance matching device comprises at least two of said inductor portion,
- one terminal of a first inductor portion is connected to said electrode for bonding,
- the other terminal of the first inductor portion is connected to a second inductor portion,
- a terminal of said capacitor portion, which is not connected to the ground electrode, is connected to the portion where said first inductor portion and said second inductor portion are connected.

* * * * *